United States Patent
Kim et al.

(10) Patent No.: US 7,539,470 B2
(45) Date of Patent: May 26, 2009

(54) TRACKING FILTER FOR SELECTING CHANNEL OF WIDEBAND FREQUENCY

(75) Inventors: Tae Wook Kim, Gyeonggi-do (KR);
Dong Gu Lim, Jeollabuk-do (KR);
Bonkee Kim, Gyeonggi-do (KR);
Junghwan Lee, Gyeonggi-do (KR);
Kwyro Lee, Seoul (KR)

(73) Assignee: Integrant Technologies, Inc., Gyeonggi-Do (KR)

( * ) Notice: Subject to any disclaimer, the term of this patent is extended or adjusted under 35 U.S.C. 154(b) by 455 days.

(21) Appl. No.: 11/392,677

(22) Filed: Mar. 30, 2006

(65) Prior Publication Data

US 2006/0223485 A1 Oct. 5, 2006

(30) Foreign Application Priority Data

Apr. 1, 2005 (KR) ............... 10-2005-0027598

(51) Int. Cl.
*H04B 1/10* (2006.01)
*H04B 1/16* (2006.01)
(52) U.S. Cl. ............... 455/130; 455/307; 455/339
(58) Field of Classification Search ......... 455/290–293, 455/303–307, 338–340
See application file for complete search history.

(56) References Cited

U.S. PATENT DOCUMENTS

| 5,060,297 | A | * | 10/1991 | Ma et al. ............... 455/302 |
| 5,325,204 | A | * | 6/1994 | Scarpa ............... 348/607 |
| 6,453,157 | B1 | * | 9/2002 | Roberts ............... 455/337 |
| 6,870,441 | B2 | * | 3/2005 | Veyres et al. ............... 333/133 |
| 6,982,614 | B2 | * | 1/2006 | Humphrey ............... 333/174 |
| 7,336,939 | B2 | * | 2/2008 | Gomez ............... 455/307 |
| 7,366,486 | B2 | * | 4/2008 | Vorenkamp et al. ...... 455/182.3 |
| 2001/0027093 | A1 | * | 10/2001 | Krug ............... 455/266 |
| 2006/0154636 | A1 | * | 7/2006 | Shah et al. ............... 455/290 |

* cited by examiner

*Primary Examiner*—Simon D Nguyen
(74) *Attorney, Agent, or Firm*—Foley & Lardner LLP

(57) ABSTRACT

The present invention relates to a filter, and more particularly, to a tracking filter for selecting a channel of a wideband frequency. The tracking filter for selecting a channel of a wideband frequency, which is for increasing the selectivity of a wideband frequency, includes: a first tracking portion for filtering and amplifying a specific frequency band while converting a low input impedance of the input terminal of the tracking filter into a high impedance; a second tracking portion for maintaining the high impedance of the first tracking portion, and for filtering and amplifying the specific frequency band while increasing the selectivity Q of a frequency outputted from the first tracking portion; and a third tracking portion for filtering the specific band wherein has low input impedance and high output impedance.

9 Claims, 5 Drawing Sheets

FIG. 1  PRIOR ART
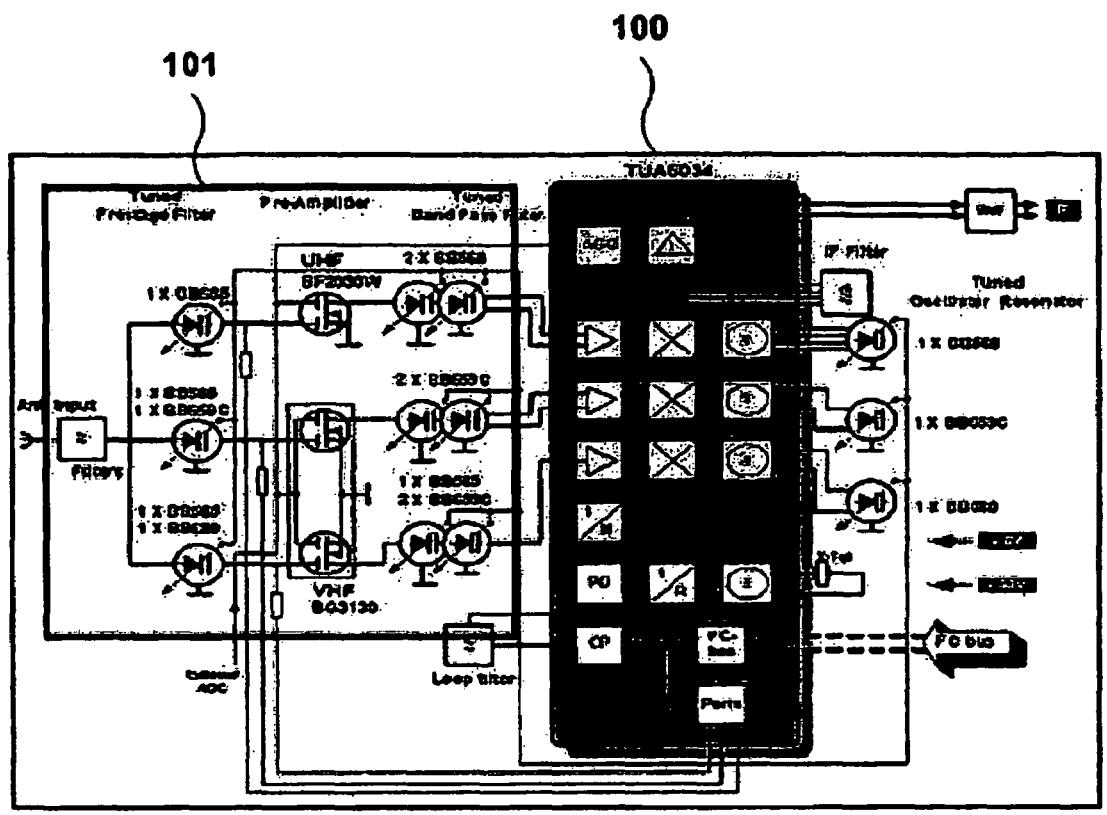
FIG. 2
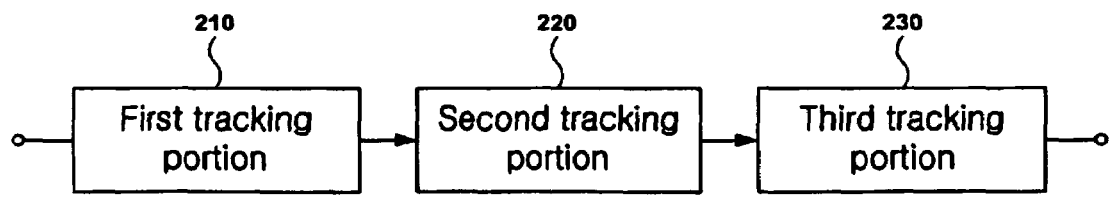

TRACKING FILTER FOR SELECTING CHANNEL OF WIDEBAND FREQUENCY

This Nonprovisional application claims priority under 35 U.S.C. § 119(a) on Patent Application No. 10-2005-0027598 filed in Korea on Apr. 1, 2006, the entire contents of which are hereby incorporated by reference.

BACKGROUND OF THE INVENTION

1. Field of the Invention

The present invention relates to a filter, and more particularly, to a tracking filter for selecting a channel of a wideband frequency.

2. Background of the Related Art

Since there are 120 TV channel signals mixed together in a wide band, signal interference between adjacent channels becomes an issue.

To solve such an issue, a variety of methods such as a double conversion tuner method and a single conversion tuner method exist.

Here, the single conversion tuner comprises a tracking filter.

That is, the linearity of the tuner can be improved by comprising a tracking filter in the tuner so as to perform a channel selection.

Among such single conversion tuners, there is a 3-band division tuner of Infineon Technologies as one of the recently developed techniques.

FIG. 1 is a block diagram of a conventional 3-band division tuner.

The conventional 3-band division tuner depicted FIG. 1 illustrates a schematic block diagram of a tuner of Infineon Inc. The 3-band division tuner 100 comprises a tracking filter 101 for channel selection.

Here, the tracking filter 101 serves as a filter for tracking a 3-band frequency.

The 3-band indicates a VHFL frequency band of about 57 to 159 MHz, a VHFH frequency band of about 165 to 453 MHz and a UHF frequency band of about 459 to 861 MHz.

That is, since there is no a switching structure for channel selection in the conventional 3-band division tuner, the characteristics of a resonator, the tracking performance and the image rejection performance of the conventional 3-band division tuner are enhanced as compared to the existing 2-band (VHF/UHF) receiver.

The power consumption of the conventional 3-band division tuner becomes lower than that of a double conversion tuner, and it can be suitably used in a mobile communication terminal or portable terminal.

However, the 3-band division tuner 100 of Infineon Inc. is disadvantageous in that a high sensitivity (high-Q) air coil LC filter should be provided on the outside thereof and a high voltage, approximately 20V, should be applied to an external varactor for tuning the frequency.

Further, there is a drawback that the tuning of the tuner should be done by manual works, which makes it not appropriate for mass production. And, due to the air coil LC filter on the outside, the outer profile of the 3-band division tuner 100 becomes bigger.

SUMMARY OF THE INVENTION

To overcome the above-described problems, an object of the present invention is to realize a tracking filter with low power consumption, low production costs and high productivity.

Another object of the present invention is to provide a tracking filter with the capability to automatically adjust for filtering the 3-band frequency.

To achieve the above objects, there is provided a tracking filter for selecting a channel of a wideband frequency according to the present invention, which is for increasing the selectivity of a wideband frequency, comprising: a first tracking portion for filtering and amplifying a specific frequency band wherein has low input impedance and high output impedance; a second tracking portion for filtering and amplifying the specific frequency band while increasing the selectivity Q of a frequency outputted from the first tracking portion wherein has high input and output impedance; and a third tracking portion for filtering the specific frequency band wherein has high input impedance and low output impedance.

Preferably, the first tracking portion comprises: an LC series type filter formed by connecting an inductor and a capacitor in series; and a common gate low noise amplifier (CG LNA) being connected to the output terminal of the LC series type filter and having a MOS transistor.

Preferably, a tapped capacitor structure for impedance conversion for improving insertion loss and skirt characteristics is further comprised at the input terminal and output terminal of the LC series type filter.

Preferably, the common gate low noise amplifier is of a multiple gated transistor (MGTR) structure in which an auxiliary MOS transistor is added in order to increase the linearity, the source and drain of each of the MOS transistor and auxiliary MOS transistor are coupled to each other, a different bias is applied to each gate, an input signal is commonly inputted into the coupled source, and an amplified signal is outputted from the coupled drain is outputted.

Preferably, the auxiliary MOS transistor is one or more of transistors connected in parallel.

Preferably, an MOS transistor is further comprised at the output terminal of the common gate low noise amplifier to form a cascode configuration in order to enhance the frequency characteristics of the common gate low noise amplifier.

Preferably, the second tracking portion comprises: an LC parallel type filter connected to the output terminal of the first tracking portion and formed by connecting an inductor and a capacitor in parallel in order to have a high reception sensitivity (high-Q); and a common source (CS) amplifier connected to the output terminal of the LC parallel type filter and having an MOS transistor which constitutes a common source circuit and applies an input signal to a gate terminal.

Preferably, the LC parallel type filter is one or more of filters connected in parallel.

Preferably, the third tracking portion comprises: an LC parallel type filter connected to the output terminal of the second tracking portion and formed by connecting an inductor and a capacitor in parallel; and a tapped capacitor structure for impedance conversion connected to the output terminal of the LC parallel type filter, for improving insertion loss and skirt characteristics.

Preferably, the third tracking portion comprises: an LC parallel type filter connected to the output terminal of the second tracking portion and formed by connecting an inductor and a capacitor in parallel; and a source follower connected to the output terminal of the LC parallel type filter, for efficiently transferring an input signal to the output terminal without a change in phase since the waveform and phase of the input signal are made equal.

Preferably, an LC series type filter is further comprised at the output terminal of the source floor.

Concrete features of other embodiments are comprised in the detailed descriptions and drawings.

Advantages and features of the present invention and a method of achieving the advantages and the features will be apparent by referring to embodiments described below in detail in connection with the accompanying drawings. However, the present invention is not limited to the embodiments disclosed below and may be implemented in various different forms. The exemplary embodiments are provided only for completing the disclosure of the present invention and for fully representing the scope of the present invention to those skilled in the art and the present invention is defined only by the appended claims. Like reference numerals designate like elements throughout the detailed description.

BRIEF DESCRIPTION OF THE DRAWINGS

FIG. 1 is a block diagram of a conventional 3-band division tuner;

FIG. 2 is a block diagram of a tracking filter for selecting a channel of a wideband frequency according to the present invention;

DETAILED DESCRIPTION OF THE PREFERRED EMBODIMENTS

Preferred embodiments of the present invention will be described in a more detailed manner with reference to the drawings.

FIG. 2 is a block diagram of a tracking filter for selecting a channel of a wideband frequency according to the present invention.

As illustrated in FIG. 2, the tracking filter comprises a first tracking portion 210, a second tracking portion 220 and a third tracking portion 230.

The first tracking portion 210 has a low input impedance and a high output impedance, and filters and amplifies a specific frequency band of an input signal.

The second tracking portion 220 has a high input and output impedance, and filters and amplifies a specific frequency band while increasing the selectivity Q of the specific frequency band outputted from the first tracking portion 210.

The third tracking portion 230 has a high input impedance and a low output impedance, and filters a specific frequency band.

The tracking filter can be used in a wide range of frequency bands, and employed as a structure capable of selectively identifying only a specific frequency band.

A detailed description of the first to third tracking portions will be made in FIGS. 3a to 3c.

Figure 3A:
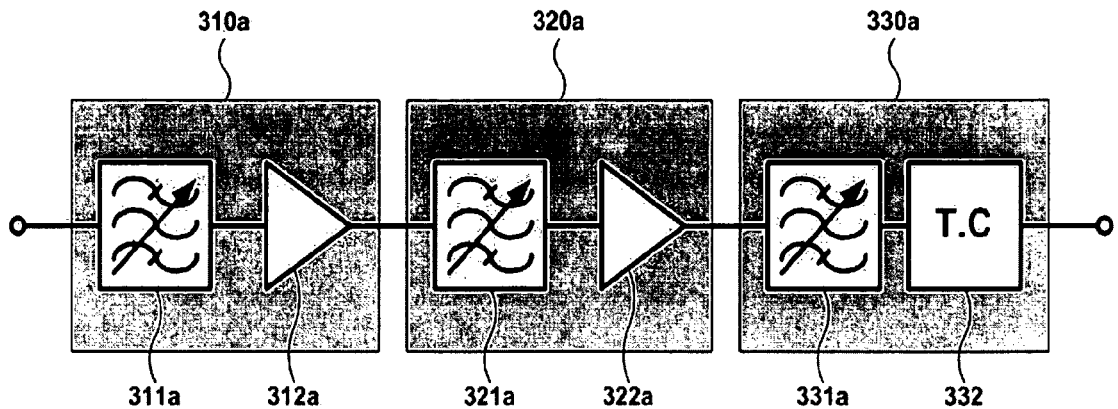
FIG. 3a is a block diagram of a tracking filter for selecting a channel of a wideband frequency according to one embodiment of the present invention.

FIG. 3a is a block diagram of a tracking filter for selecting a channel of a wideband frequency according to one embodiment of the present invention.

As illustrated in FIG. 3a, the tracking filter comprises a first tracking portion 310a, a second tracking portion 320a and a third tracking portion 330a.

The first tracking portion 310a comprises an LC series type filter 311a and a common gate low noise amplifier (CG LNA) 312a.

The LC series type filter 311a comprises an inductor L and a capacitor C. The inductor L and the capacitor C are connected in series. The LC series type filter 311a has relatively low input and output impedances in order to reduce insertion loss and to maintain good skirt characteristics.

The common gate low noise amplifier 312a is a common gate circuit connected to the output terminal of the LC series type filter 311a, and comprised of an MOS transistor which applies an input signal to the source terminal so that an input impedance is low and an output impedance is high.

The first tracking portion 310a converts from a low impedance into a high impedance in order to increase the selectivity when filtering a specific frequency band of an input signal.

The second tracking portion 320a is connected to the output terminal of the first tracking portion 310a, and comprises an LC parallel type filter 321a and a common source (CS) amplifier 322a.

The LC parallel type filter 321a comprises an inductor L and a capacitor C. The inductor L and the capacitor C are connected in series. The LC parallel type filter 321a has relatively high input and output impedances so as to have high reception sensitivity (high-Q) in terms of selectivity.

The common source amplifier 322a comprises a transistor which is connected to the output terminal of the LC parallel type filter 321a, constitutes a common source circuit. An input signal is applied to the gate terminal of the transistor.

Thus, the second tracking portion 320a can select a certain frequency band easily.

The third tracking portion 330a comprises an LC parallel type filter 331a and a tapped capacitor 332 and is connected to the output terminal of the second tracking portion 320a.

The LC parallel type filter 331a comprises an inductor and a capacitor. The inductor and the capacitor are connected in series.

The tapped capacitor 332 is connected to the output terminal of the LC parallel type filter 331a to reduce insertion loss and to improve skirt characteristics.

Thus, the third tracking portion 330a has a high impedance at the input terminal in order to increase the selectivity of the parallel type filter, and has a low impedance at the output terminal by using the tapped capacitor 332 in order to match with a general RF (radio frequency) matching impedance of 50 Ω.

Moreover, according to the above-described one embodiment of FIG. 3a, while an LC series type filter is used in a tracking interval desired to have a relatively low input and output impedance, an LC parallel type filter is used in a tracking interval desired to have a relatively high input and output impedance, thereby realizing a tracking filter that can be used in a wide range of frequency bands.

Concrete examples of the LC series type filter and LC parallel type filter will be described in more detail with reference to FIGS. 4 to 6.

Figure 3B:
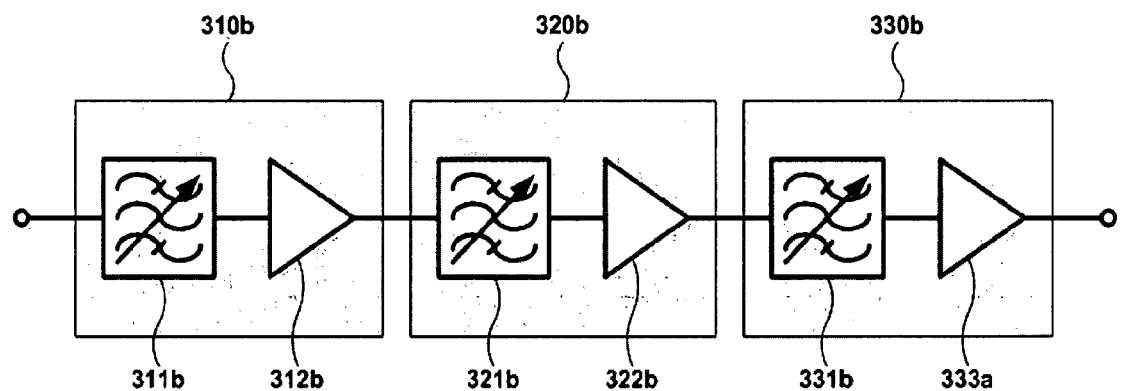
FIG. 3b is a block diagram of a tracking filter for selecting a channel of a wideband frequency according to another embodiment of the present invention.

FIG. 3b is a block diagram of a tracking filter for selecting a channel of a wideband frequency according to another embodiment of the present invention.

As illustrated in FIG. 3b, the tracking filter comprises a first tracking portion 310b, a second tracking portion 320b and a third tracking portion 330b.

The first tracking portion 310b includes an LC series type filter 311b and a common gate low noise amplifier 312b.

The LC series type filter 311b comprises an inductor L and a capacitor C. The inductor L and the capacitor C are connected in series. The LC series type filter 311b has relatively low input and output impedances in order to reduce insertion loss and to improve skirt characteristics.

The common gate low noise amplifier 312b comprises a common gate circuit and is connected to the output terminal of the LC series type filter 311b. An input signal is applied to the source terminal of the common gate circuit. The common gate low noise amplifier 312b has a low input impedance and a high output impedance.

Thus, the first tracking portion 310b converts from a low impedance into a high impedance so as to increase the selectivity when filtering a specific frequency band of an input signal.

The second tracking portion 320b comprises an LC parallel type filter 321b and a common source amplifier 322b and is connected to the output terminal of the first tracking portion 310b.

The LC parallel type filter 321b comprises an inductor L and a capacitor C. The inductor L and the capacitor C is connected in series. The LC parallel type filter 321b has relatively high input and output impedances so as to have high reception sensitivity (high-Q) in terms of selectivity.

The common source amplifier 322b is comprised of a transistor which is connected to the output terminal of the LC parallel type filter 321b, constitutes a common source circuit. An input signal is applied to the gate terminal of the transistor.

Thus, it is made easier for the second tracking portion 320b to select a frequency.

The third tracking portion 330b is connected to the output terminal of the second tracking portion 320b, and comprises an LC parallel type filter 331b and a source follower 333a.

The LC parallel type filter 331b has a structure formed by connecting an inductor and a capacitor in series.

The source follower 333a is connected to the output terminal of the LC parallel type filter 331b to efficiently transfer an input signal to the output terminal without a change in phase.

Thus, the third tracking portion 330b has a high impedance at the input terminal in order to increase the selectivity of the parallel type filter, and has a low impedance at the output terminal by using the source follower 333a in order to match with a general RF (radio frequency) matching impedance of 50 Ω.

A further explanation of the above described LC series type filter 311b, common gate low noise amplifier 312b and LC parallel type filters 321b and 331b will be made with reference to FIGS. 4 to 6.

Figure 3C:
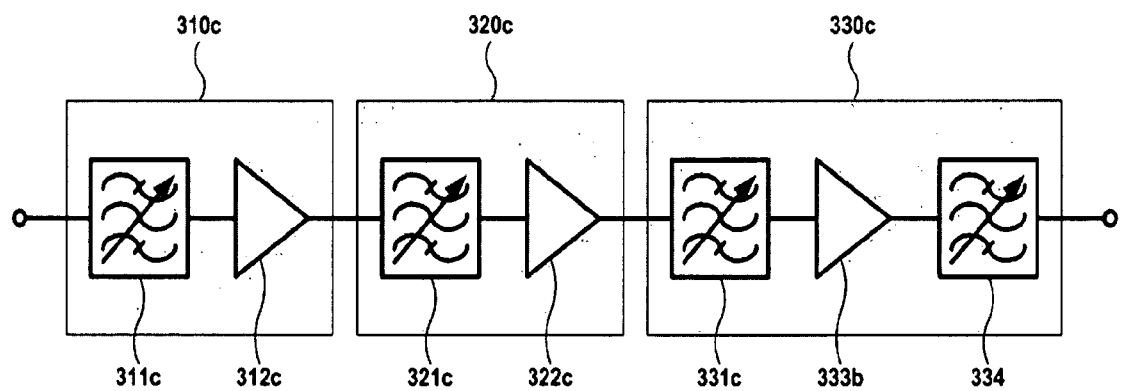
FIG. 3c is a block diagram of a tracking filter for selecting a channel of a wideband frequency according to yet another embodiment of the present invention.

FIG. 3c is a block diagram of a tracking filter for selecting a channel of a wideband frequency according to yet another embodiment of the present invention.

As illustrated in FIG. 3c, the tracking filter comprises a first tracking portion 310c, a second tracking portion 320c and a third tracking portion 330c.

The first tracking portion 310c comprises an LC series type filter 311c and a common gate low noise amplifier 312c.

The LC series type filter 311c comprises an inductor L and a capacitor C. The inductor L and the capacitor C are connected in series. The LC series type filter 311c has used with relatively low input and output impedances in order to reduce insertion loss and to maintain skirt characteristics at an excellent level.

The common gate low noise amplifier 312c is a common gate circuit connected to the output terminal of the LC series type filter 311c, and comprised of an MOS transistor which applies an input signal to the source terminal so that an input impedance is low and an output impedance is high.

Thus, when filtering a specific frequency band of an input signal the selectivity of the first tracking portion 310c increases.

The second tracking portion 320b is connected to the output terminal of the first tracking portion 310c, and includes an LC parallel type filter 321c and a common source amplifier 322c.

The LC parallel type filter 321c comprises an inductor L and a capacitor C. The inductor L and a capacitor C are connected in series. The LC parallel type filter 321c has relatively high input and output impedance so as to have a high reception sensitivity (high-Q) in terms of selectivity.

The common source amplifier 322c is comprised of a transistor which is connected to the output terminal of the LC parallel type filter 321c, constitutes a common source circuit and applies an input signal to a gate terminal.

Thus, it is made easier for the second tracking portion 320c to select a frequency.

The third tracking portion 330c is connected to the output terminal of the second tracking portion 320c, and includes an LC parallel type filter 331c, a source follower 333a and an LC series type filter 334.

The LC parallel type filter 331c has a structure formed by connecting an inductor and a capacitor in series.

The source follower 333b is connected to the output terminal of the LC parallel type filter 331c to thus efficiently transfer an input signal to the output terminal without a change in phase since the waveform and phase of the input signal are made equal.

The LC series type filter 334 comprises an inductor L and a capacitor C. The inductor L and the capacitor C are connected in series. The LC series type filter 334 has relatively low input and output impedance in order to reduce insertion loss and to maintain skirt characteristics at the output terminal of the source follower 333b at an excellent level.

Thus, the third tracking portion 330c has a high impedance at the input terminal in order to increase the selectivity of the parallel type filter, and has a low impedance at the output terminal in order to increase the selectivity of the series type filter. Alternately, it is required to keep a low impedance in order to match with a general RF (radio frequency) matching impedance of 50Ω, so a high to low input impedance is provided by using the source follower 333b.

A further explanation of the above described LC series type filters 311c and 334, common gate low noise amplifier 312c and LC parallel type filters 321c and 331c will be made with reference to FIGS. 4 to 6.

Figure 4A:
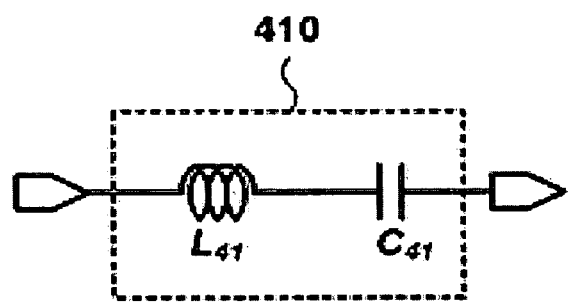
FIG. 4a is a circuit diagram of an LC series type filter according to the present invention.

FIG. 4a is a circuit diagram of an LC series type filter according to the present invention.

As illustrated in FIG. 4a, the LC series type filter 410 is less sensitive to the degradation of a Q value caused by a MOS (metal-oxide semiconductor) switch because an inductor L41 and a capacitor are connected in series.

When the input impedance and the output impedance are kept constant, the insertion loss and skirt characteristics are maintained at an excellent level at the time of sweeping the central frequency.

Figure 4B:
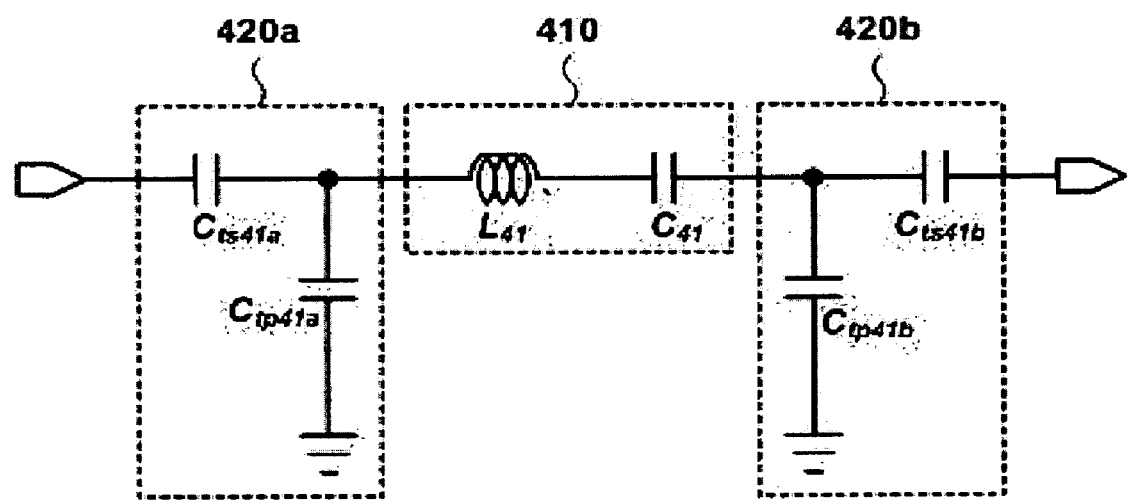
FIG. 4b is a circuit diagram in which a tapped capacitor (tapped C) structure for impedance conversion is added to the LC series type filter according to the present invention.

FIG. 4b is a circuit diagram in which a tapped capacitor (tapped C) structure for impedance conversion is added to the LC series type filter according to the present invention.

As illustrated in FIG. 4b, the LC series type filter 410 with the tapped C structure 420a and 402b for impedance conversion added thereto includes an input side impedance converting tapped capacitor portion 420a, an output side impedance converting tapped capacitor portion 420b and an LC series type filter 410.

The input side impedance converting tapped capacitor portion 420a includes a serial capacitor Cts41a and a parallel capacitor Ctp41a, the output side impedance converting tapped capacitor portion includes a serial capacitor Cts41b and a parallel capacitor Cts41b, and the LC series type filter 410 includes an inductor L41 and a capacitor C41.

That is, the input side impedance converting tapped capacitor portion 420a converts an impedance of 50Ω into an impedance of 10Ω, and the output side impedance converting tapped capacitor portion 420b converts an impedance of 10Ω into an impedance of 50Ω.

Further, the LC series type filter 410 is less sensitive to the degradation of a Q value caused by a MOS switch because it is formed by connecting the inductor L41 and the capacitor C41 in series, and adjusts insertion loss and skirt characteristics that are in a trade-off relation to each other by converting an impedance by means of the tapped capacitor portions 420a and 420b.

When the input impedance and the output impedance are kept constant, the insertion loss and skirt characteristics are maintained at an excellent level at the time of sweeping the central frequency.

Figure 5A:
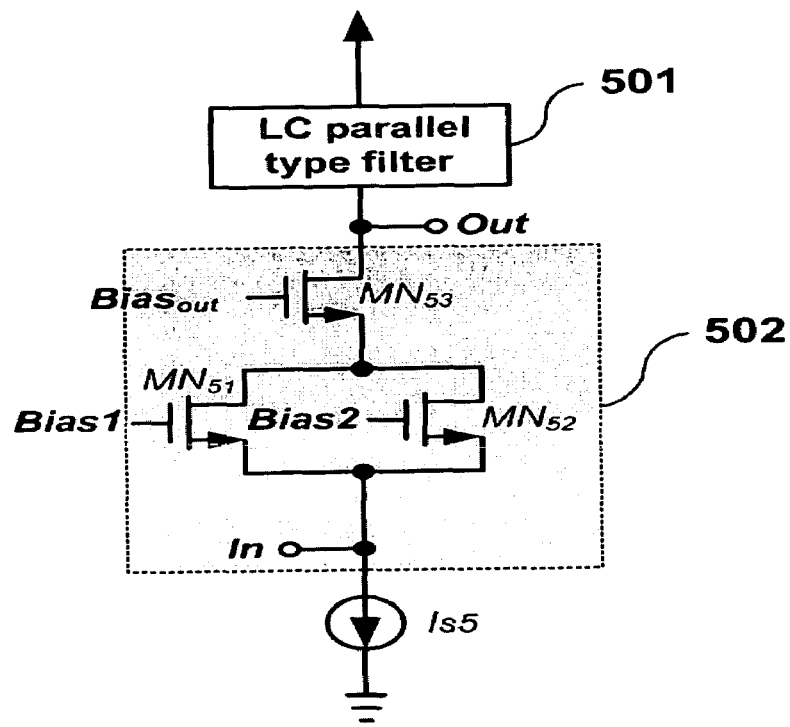
FIG. 5a is a circuit diagram of a common gate low noise amplifier according to the present invention.

FIG. 5a is a circuit diagram of a common gate low noise amplifier according to the present invention.

In the LNA, an amplifying portion 502 may be formed of a main MOS transistor alone, or may be formed of a multiple gated transistor (MGTR) consisting of a main MOS transistor and an auxiliary MOS transistor, or may be formed in a cascode configuration by having a main MOS transistor and an auxiliary MOS transistor and adding a MOS transistor at the output terminal of the amplifying portion.

No matter what configuration the LNA is formed in, the operating characteristics are similar, and the following description will be made with respect to an example in which the amplifying portion has a MGTR and cascode configuration.

As illustrated in FIG. 5a, the LNA includes a main MOS transistor MN51, an auxiliary MOS transistor MN52 (MGTR), an MOS transistor MN53 and a current source Is5.

By connecting the drain of the MOS transistor MN53 along with the output terminal to the LC parallel type filter and commonly connecting the source thereof to the drain of the transistors MN51 and MN52 of the amplifying circuit, a cascode configuration is formed, and the frequency characteristics of the main MOS transistor MN51 and auxiliary MOS transistor MN52 are improved.

The main MOS transistor MN51 and the auxiliary MOS transistor MN52, respectively, constitute a common gate circuit which applies an input signal to their source, and each source is coupled to each other to apply an input signal, each drain is coupled to each other to connect to the source of the MOS transistor MN53, and each gate is applied with a different bias Bias1 and Bias2.

The main transistor MN51 and the auxiliary MOS transistor MN52, respectively, are comprised of a MOS transistor having different characteristics such as a channel width or length. Thus, at the time of the amplification of the main MOS transistor MN51, the auxiliary MOS transistor MN52 having different characteristics operates together and therefore, reduces IMD3 (3rd-order intermodulation distortion), thereby improving IIP3 (3rd input intercept point).

In a case where the amplification device of the LNA is formed by using a common gate transistor, the input impedance can be reduced to less than 50Ω, and the output impedance can be increased to be higher.

This enables the terminal impedance of a LC series type filter to be smaller, and on the contrary, enables the terminal impedance of a LC parallel type filter to be higher, thereby satisfying the conditions of performance improvement of both LC series type filter and LC parallel type filter.

Further, even if the LC series type filter is not used due to a noise figure (NF) problem, the input impedance can be set to a wideband 50Ω by adjusting the current, and therefore is made suitable for a circuit using a wide band, too.

Further, if a MGTR amplifying portion using the main MOS transistor MN51 and auxiliary MOS transistor having different characteristics is used, the linearity is further improved.

In the MGTR amplifying portion, the circuit of the linearity becomes lower because a gm" value of the main MOS transistor has a positive value. Thus, in order decrease the gm" value, the gm" is attenuated by using a negative region of the auxiliary MOS transistor MN52, which is another transistor.

At this point, in order to use a negative region of another transistor, a function of proper offset bias value and transistor channel width is adjusted.

That is, to attenuate the gm" of the main MOS transistor MN51, an auxiliary MOS transistor MN52 having a function of proper offset bias and transistor channel width is added.

Here, the auxiliary MOS transistor MN52 is biased in the weak inversion region, so additional power consumption is low.

That is to say, it is possible to attenuate the gm" by adjusting a function of first and second bias Bias1 and Bias2 and channel width of the main transistor MN51 and auxiliary MOS transistor MN52, and accordingly, it is possible to improve the linearity further.

A variety of techniques of improving the linearity in relation to the MGTR have been applied for a patent by the present inventor in Korean Patent Application 10-2005-0060733, 10-2005-0071159 and 10-2005-0108592.

Figure 5B:
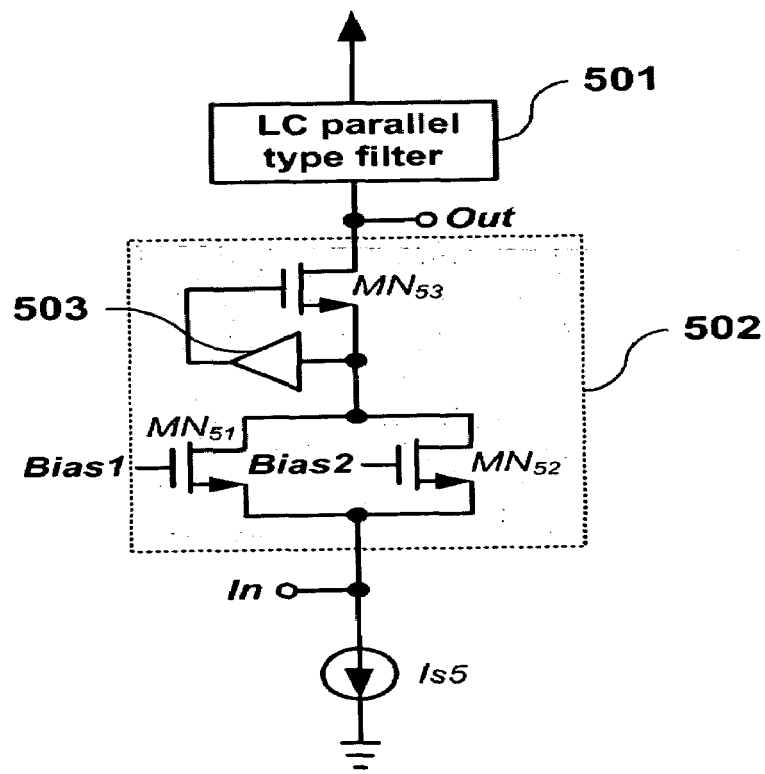
FIG. 5b is a circuit diagram in which an amplifying circuit for gain improvement is added to the common gate low noise amplifier according to the present invention.

FIG. 5b is a circuit diagram in which an amplification circuit for gain improvement is added to the common gate low noise amplifier according to the present invention.

As illustrated in FIG. 5b, the basic construction of the LNA is the same as that of the LNA shown in FIG. 5a, except that a feedback amplifying circuit 503 is added. Thus, a description will be made only with respect to the feedback amplifying circuit 503.

The output terminal of the feedback amplifying circuit 503 is connected to the gate of the transistor MN53, and the input terminal of the feedback amplifying circuit 503 is connected to a node coupled to the source of the transistor MN53 and the drain of the MGTR MN51 and MN52.

That is, the feedback amplifying circuit 503 is added between the gate and source of the transistor MN53, and thus a harmonic feedback effect generated from the MGTR MN51 and MN52 is reduced, thereby increasing the linearity IIP3 of the amplifying circuit.

Figure 6A:
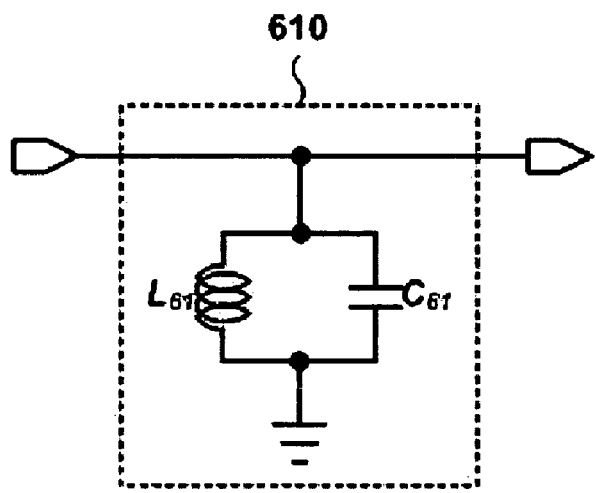
FIG. 6a is a circuit diagram of an LC parallel type filter according to the present invention.

FIG. 6a is a circuit diagram of an LC parallel type filter according to the present invention.

As illustrated in FIG. 6a, the LC parallel type filter includes an inductor L61 and a capacitor C61.

That is, in the LC parallel type filter 610, the inductor L61 and the capacitor C61 can constitute a circuit having a high Q value by being connected to each other in series, and settings for reception are done relatively easily by changing C and L values.

Figure 6B:
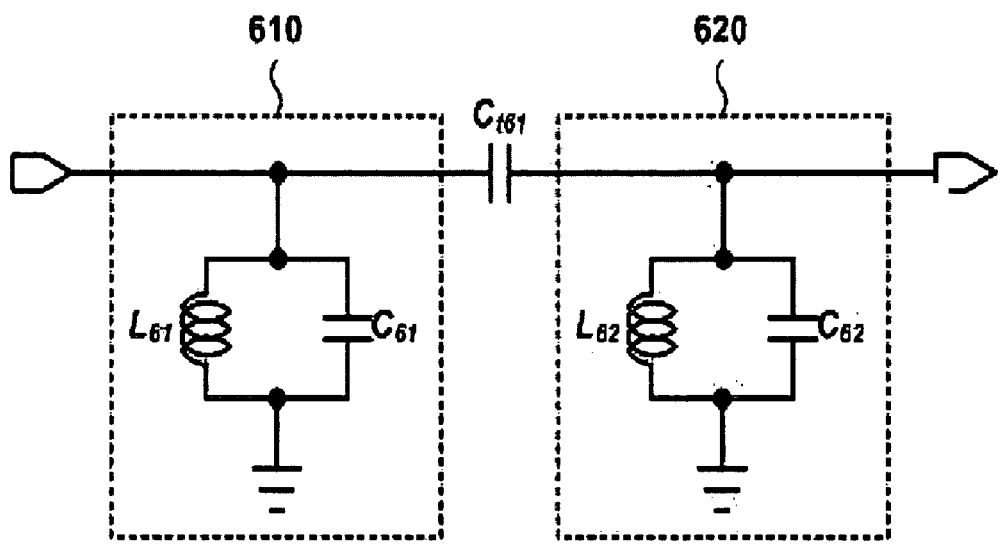
FIG. 6b is a circuit diagram in which a conversion capacitor for connecting the LC parallel type filter according to the present invention in parallel.

FIG. 6b is a circuit diagram in which a conversion capacitor for connecting the LC parallel type filter according to the present invention in parallel.

As illustrated in FIG. 6b, the LC parallel type filter with the conversion capacitor added therein includes an LC parallel type filter 610, a conversion capacitor Ct61 and an additional LC parallel type filter 620.

Here, the LC parallel type filter 610 is formed by connecting an inductor L61 and a capacitor C61 in parallel, the additional LC type filter 620 is formed by coupling an inductor L62 and a capacitor C62, and the impedance converting capacitor Ct61 is connected between the LC parallel type filter 610 and the additional LC parallel type filter 620.

That is, in the LC parallel type filter 610 and 620, the inductor L61 and L62 and the capacitor C61 and C62 can constitute a high Q value by being connected to each other in parallel, and settings for reception are done relatively easily by changing C and L values.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

EFFECTS OF THE INVENTION

According to the first embodiment of the present invention as described above, it is possible to realize a tracking filter with low power consumption, low production costs and high productivity.

Furthermore, according to the present invention, it is possible to provide a tracking filter with the capability to automatically adjust for filtering the 3-band frequency.

What is claimed is:

1. A tracking filter for selecting a channel of a wideband frequency, which is for increasing the selectivity of a wideband frequency, comprising:
   a first tracking portion for filtering and amplifying a specific frequency band, wherein the first tracking portion has a low input impedance and a high output impedance;
   a second tracking portion for filtering and amplifying the specific frequency band while increasing the selectivity Q of a frequency outputted from the first tracking portion, wherein the second tracking portion has a high input impedance and a high output impedance; and
   a third tracking portion coupled to an output of the second tracking portion for filtering the specific frequency band, wherein the third tracking portion has a high input impedance and a low output impedance,
   wherein the first tracking portion comprises:
   an LC series type filter formed by connecting an inductor and a capacitor in series; and
   a common gate low noise amplifier (CG LNA) being connected to the output terminal of the LC series type filter and having a MOS transistor.

2. The tracking filter as claimed in claim 1, wherein tapped capacitors are further included at the input terminal and output terminal of the LC series type filter.

3. The tracking filter as claimed in claim 1, wherein the common gate low noise amplifier is of a multiple gated transistor (MGTR) structure in which an auxiliary MOS transistor is further included, the source and drain of each of the MOS transistor and auxiliary MOS transistor are coupled to each other, a different bias is applied to each gate, an input signal is commonly inputted into the coupled source, and an amplified signal is outputted from the coupled drain is outputted.

4. The tracking filter as claimed in claim 3, wherein the common gate low noise amplifier further comprises an MOS transistor at the output terminal of the common gate low noise amplifier.

5. A tracking filter for selecting a channel of a wideband frequency, which is for increasing the selectivity of a wideband frequency, comprising:
   a first tracking portion for filtering and amplifying a specific frequency band, wherein the first tracking portion has a low input impedance and a high output impedance;
   a second tracking portion for filtering and amplifying the specific frequency band while increasing the selectivity Q of a frequency outputted from the first tracking portion, wherein the second tracking portion has a high input impedance and a high output impedance; and
   a third tracking portion coupled to an output of the second tracking portion for filtering the specific frequency band, wherein the third tracking portion has a high input impedance and a low output impedance,
   wherein the second tracking portion comprises:
   an LC parallel type filter connected to the output terminal of the first tracking portion and formed by connecting an inductor and a capacitor in parallel; and
   a common source (CS) amplifier connected to the output terminal of the LC parallel type filter.

6. The tracking filter as claimed in claim 5, wherein the LC parallel type filter is one or more of filters connected in parallel.

7. A tracking filter for selecting a channel of a wideband frequency, which is for increasing the selectivity of a wideband frequency, comprising:
   a first tracking portion for filtering and amplifying a specific frequency band, wherein the first tracking portion has a low input impedance and a high output impedance;
   a second tracking portion for filtering and amplifying the specific frequency band while increasing the selectivity Q of a frequency outputted from the first tracking portion, wherein the second tracking portion has a high input impedance and a high output impedance; and
   a third tracking portion coupled to an output of the second tracking portion for filtering the specific frequency band, wherein the third tracking portion has a high input impedance and a low output impedance,
   wherein the third tracking portion comprises:
   an LC parallel type filter connected to the output terminal of the second tracking portion and formed by connecting an inductor and a capacitor in parallel; and
   a tapped capacitor connected to the output terminal of the LC parallel type filter.

8. A tracking filter for selecting a channel of a wideband frequency, which is for increasing the selectivity of a wideband frequency, comprising:
- a first tracking portion for filtering and amplifying a specific frequency band, wherein the first tracking portion has a low input impedance and a high output impedance;
- a second tracking portion for filtering and amplifying the specific frequency band while increasing the selectivity Q of a frequency outputted from the first tracking portion, wherein the second tracking portion has a high input impedance and a high output impedance; and
- a third tracking portion coupled to an output of the second tracking portion for filtering the specific frequency band, wherein the third tracking portion has a high input impedance and a low output impedance,
- wherein the third tracking portion comprises:
- an LC parallel type filter connected to the output terminal of the second tracking portion and formed by connecting an inductor and a capacitor in parallel; and
- a source follower low noise amplifier connected to the output terminal of the LC parallel type filter.

9. The tracking filter as claimed in claim 8, wherein the third tracking portion further comprises an LC series type filter at the output terminal of the source follower.

* * * * *